United States Patent [19]
Staudinger et al.

[11] Patent Number: 5,339,462
[45] Date of Patent: Aug. 16, 1994

[54] BROADBAND MIXER CIRCUIT AND METHOD

[75] Inventors: Joseph Staudinger, Gilbert; William B. Beckwith; Warren L. Seely, both of Chandler, all of Ariz.

[73] Assignee: Motorola, Inc., Schaumburg, Ill.

[21] Appl. No.: 787,354

[22] Filed: Nov. 4, 1991

[51] Int. Cl.[5] .................................................. H04B 1/26
[52] U.S. Cl. ..................................... 455/330; 455/326; 333/118
[58] Field of Search ........................... 455/317–320, 455/323–326, 330, 333; 333/118

[56] References Cited

U.S. PATENT DOCUMENTS

| | | | |
|---|---|---|---|
| 3,681,697 | 8/1972 | Moroney | 455/319 |
| 3,831,097 | 8/1974 | Neuj | 455/326 |
| 4,864,644 | 9/1989 | Takahashi et al. | 455/326 |
| 5,006,811 | 4/1991 | Kruger | 329/354 |
| 5,023,576 | 6/1991 | Staudinger et al. | 333/118 |
| 5,045,821 | 9/1991 | Staudinger et al. | 333/118 |

OTHER PUBLICATIONS

Hallford, Ben R., "Trace Phase statest check Mixer Designs", Microwaves, Jun. 1989, p. 53t.

Primary Examiner—Reinhard J. Eisenzopf
Assistant Examiner—Chi Pham
Attorney, Agent, or Firm—Frederick M. Fliegel

[57] ABSTRACT

A signal mixing apparatus comprising first and second four port signal splitting/combining networks having no relative phase shift between three ports and 180° of phase shift between the remaining ports, coupled to a four port mixer element. The mixer element has two ports coupled to the first signal splitter/combiner network and having another two ports coupled to the second splitter/combiner, RF and LO signals input to the first splitter/combiner do not appear at the IF output from the second splitter/combiner or vice versa. The RF/IF signals cancel and the LO signal is trapped by a resonant circuit within the mixer. The RF and IF frequency bands may overlap.

26 Claims, 4 Drawing Sheets

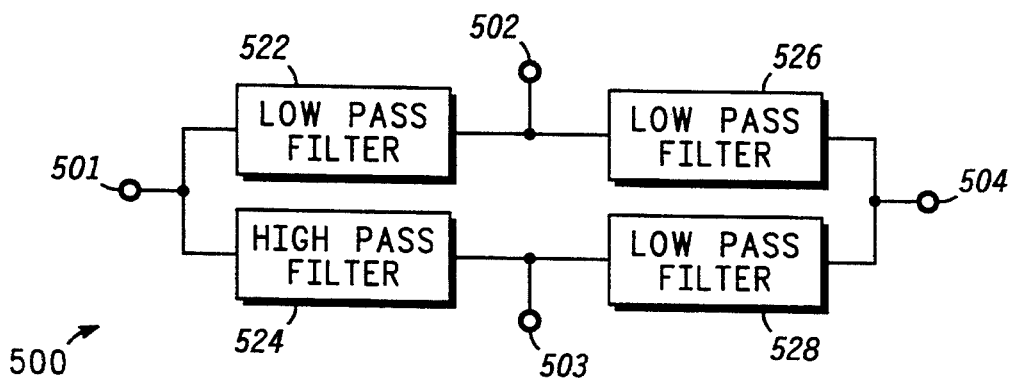
FIG. 5
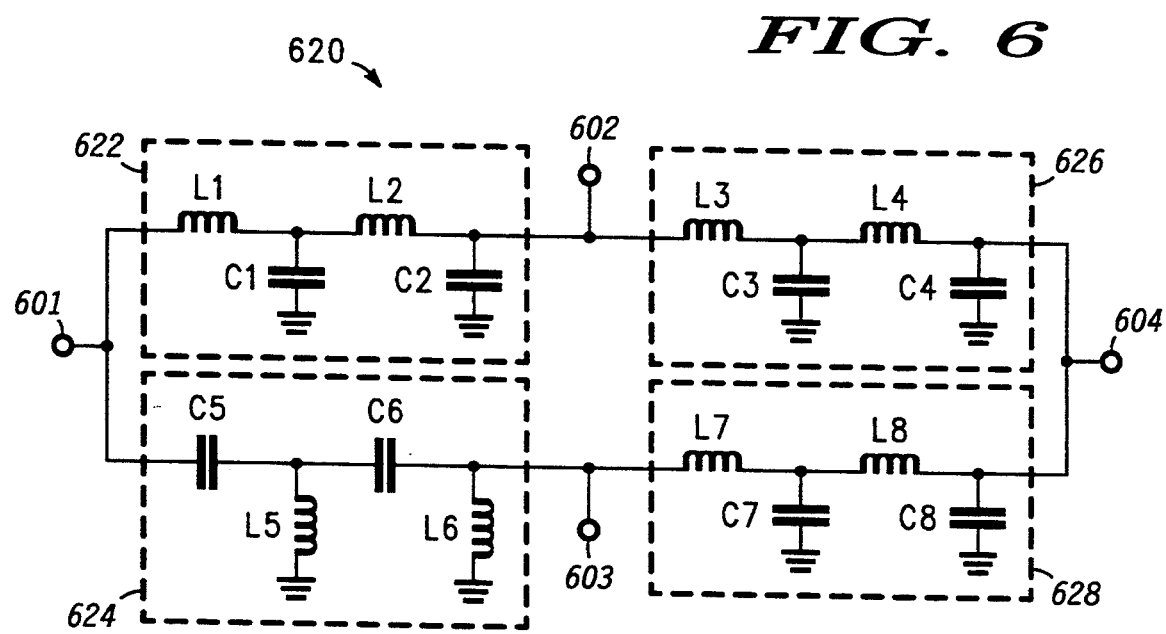
FIG. 6
FIG. 7A
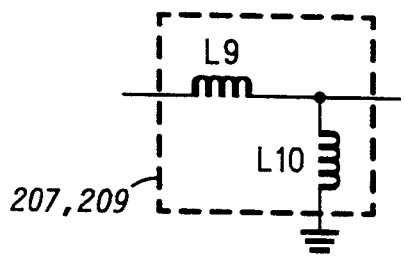
FIG. 7B
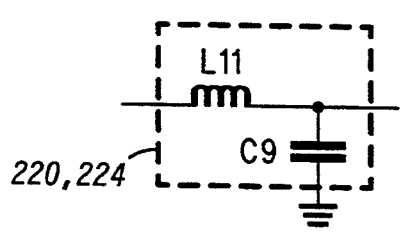

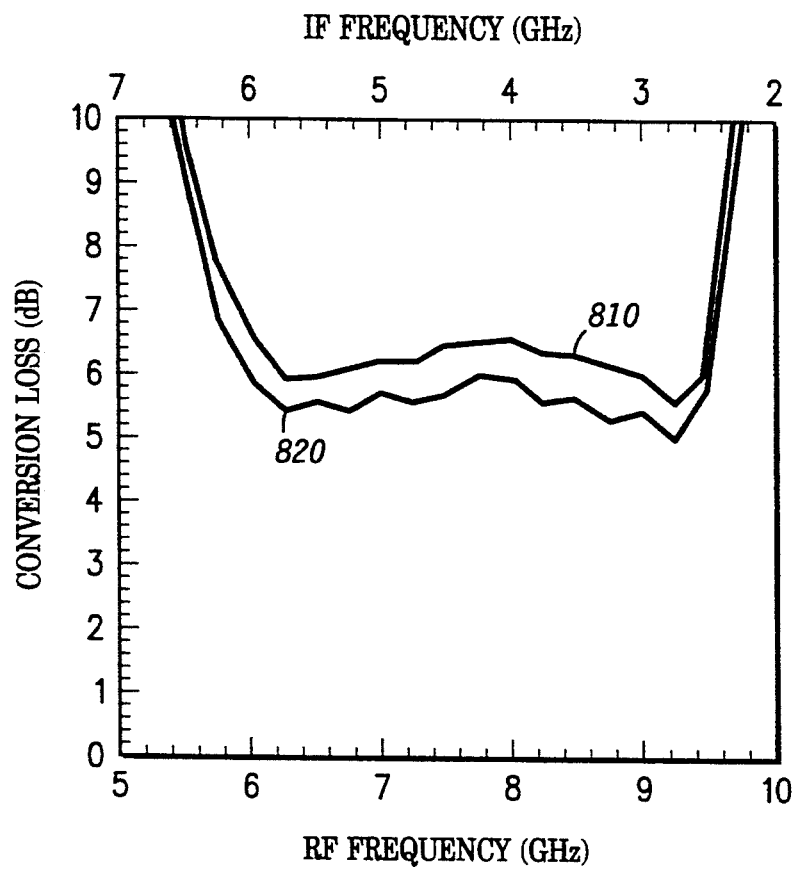
FIG. 8
FIG. 9
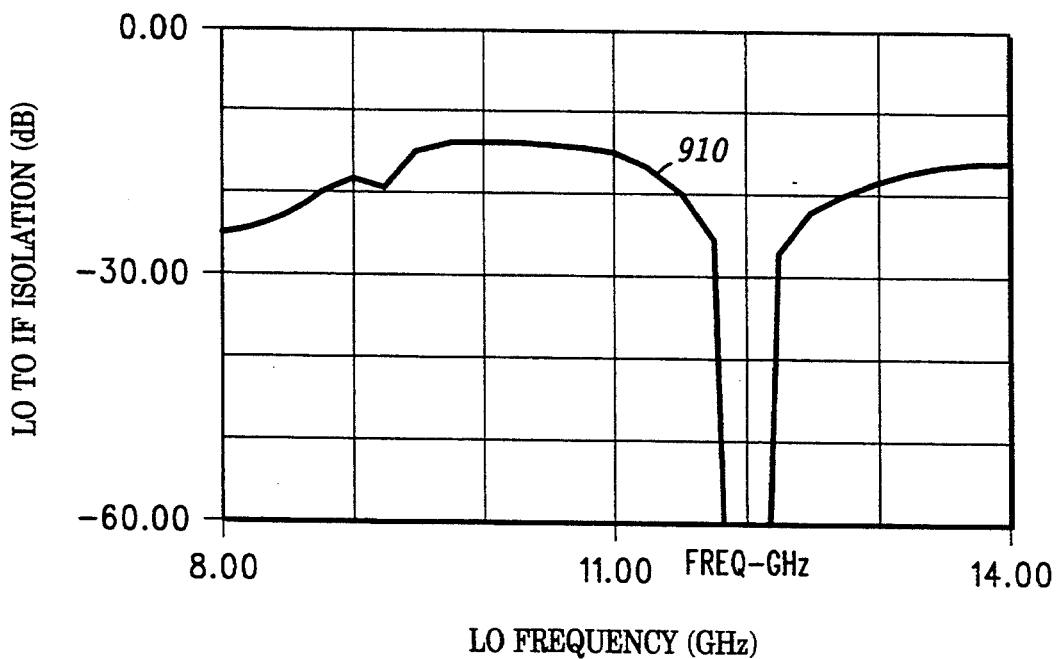

BROADBAND MIXER CIRCUIT AND METHOD

CROSS-REFERENCE TO RELATED APPLICATIONS

The resent application is related to co-pending U.S. patent application Ser. Nos. 719,202, 718,726, 677,688, now U.S. Pat. No. 5,214,796, issued May 6, 1993, and 620,692, now U.S. Pat. No. 5,128,638, issued Jul. 7, 1992, which are assigned to the same assignee as the present invention.

FIELD OF THE INVENTION

The present invention concerns an improved means and method for mixing electrical signals.

DESCRIPTION OF THE PRIOR ART

It is commonplace in the electronic art to combine a modulated or modulating signal with a local oscillator signal in order to obtain a further modulated signal at another frequency that is more easily amplified, filtered, broadcast, and/or detected. This is done in a mixer.

In a typical demodulation application, a modulated radio frequency (RF) signal is combined in a mixer with a local oscillator (LO) signal to produce an intermediate frequency (IF) signal which may be then further amplified and detected to recover the information modulated onto the RF signal or carrier. Alternatively, this process can be reversed, mixing an LO signal with an IF signal to produce as a product signal a modulated carrier signal for further amplification and ultimate transmission as a modulated output signal.

The demodulation mixing process produces sums and differences of the RF and LO frequencies. One or more of the sum and difference frequencies is at the desired IF frequency, according to the following relations:

(1) $f_{IF}=f_{LO}-f_{RF}$, i.e., down conversion where $f_{LO}>f_{RF}$, (2) $f_{IF}=f_{RF}-f_{RF}$, i.e., down conversion where $f_{LO}>f_{RF}$, (3) $f_{IF}=f_{LO}-f_{RF}$, i.e., up conversion.

Similar relations apply to modulation of a carrier signal.

Examination of equations (1)–(3) shows that there is not a unique correspondence between $f_{LO}$, $f_{IF}$, and $f_{RF}$. For a given value of $f_{LO}$, two different values of fRF may produce the same value of $f_{IF}$.

FIG. 1 is by way of example a simplified representation of RF, LO, and IF signals of different ranges of frequencies showing how RF signals RF1, RF2 are related in frequency to IF signals IF1, IF2. FIG. 1 also illustrates overlap region 101, showing a range wherein the IF and RF signal bands may coincide. For $f_{LO}=12$ GigaHertz, both $f_{RF1}=5.5-9.5$ GigaHertz and $f_{RF2}=14.5-18.5$ GigaHertz can produce $f_{IF}=2.5-6.5$ GigaHertz. The RF and IF signal frequencies are generally not discrete frequencies but narrow frequency bands determined by the modulation thereon. For the example of FIG. 1, the RF signal frequency may be anywhere in the bands RF1=5.5-9.5 GHz or RF2=14.5-18.5 GigaHertz. With a LO frequency of 12 GigaHertz, the IF will vary from 2.5-6.5 GigaHertz, overlapping the RF1 band from 5.5 to 6.5 GigaHertz. The LO frequency is typically sharply defined, but may be time varying in some cases.

FIG. 2 is a simplified schematic representation of double balanced mixer apparatus 10, according to the prior art. Mixer apparatus 10 comprises input 12, input 42, output 15, balun transformers 16, 40, and four port mixer element 19 comprising diodes 32, 34, 36, 38, and having input ports 24, 26, 28, 30. Signals 14, 18, 20, 44, 46, 48 are present in mixer apparatus 10. RF input signal 14 comprising either or both RF1 and RF2 enters at RF port 12. Balun transformer 16 splits incoming signal 14 into two substantially equal amplitude RF signals 18, 20 having a relative phase displacement of 180°. Signal 18 is sent to port 24 of four port mixer element 19 and signal 20 is sent to port 28 of mixer element 19. Similarly, LO input 42 supplies LO signal 44 to balun transformer 40. Balun transformer 40 splits LO signals 44 into two substantially equal amplitude RF signals 46, 48 having a 180° relative phase displacement. Signal 46 is sent to port 26 of four port mixer element 19 and signal 48 is sent to port 30 of four port mixer element 19.

The nonlinear current versus voltage characteristics of diodes 32, 34, 36, 38 cause signals to be created at frequencies in accordance with equations (1)–(3), which signals are coupled to IF port 15. Because balun transformers 16, 40 must be able to pass the RF, LO, and IF frequencies, the required bandwidth of the balun transformers is difficult to realize for broader bandwidth applications. Furthermore, balun transformers such as 16, 40 are generally most useful at frequencies below about one GigaHertz. This limits the frequency range over which prior art mixer apparatus 10 is useful.

Alternatively, mixers are employed for modulation of an LO signal by an IF signal to produce a modulated carrier, or RF signal. This process is similar to the demodulation process described above, with LO port 42 and IF port 15 accepting input signals and RF port 12 providing an output signal.

Prior art mixers have a number of disadvantages well known in the art. Among these disadvantages are, for example: (1) inadequate port-to-port isolation, (2) limited bandwidth, particularly intermediate frequency bandwidth, (3) relative complexity, (4) difficulty of implementation in compact form suitable for incorporation in monolithic microwave integrated circuits (MMIC's), and (5) requirements for well-defined separation between the RF, IF and LO frequencies. A further problem is realization of efficient mixers at high frequencies, e.g., those mixers where the product or output signal produced by the mixer is as large as possible for given power levels of the two input signals.

MMIC's are typically constructed using Si, GaAs, or other compound or elemental semiconductor integrated circuit (IC) wafer processing technology on and/or in such wafers. It is highly desirable to have broadband mixers which can be made with lumped elements or other structures compatible with IC fabrication techniques and geometries.

In particular, it is important that they be of comparatively small size so as to not occupy disproportionately large substrate areas compared to the semiconductor diodes, transistors, etc., which mix the signals, or compared to the amplifiers or other signal processing elements that may be included in the MMIC. Such concerns are especially important in the frequency range from about 1 to 15 GigaHertz and above where the sizes of distributed circuit elements are unwieldy.

Thus, there continues to be a need for improved broadband, efficient mixers and methods that use few components, especially those which are easy to construct and/or which employ elements that are readily integratable in and/or on MMIC's or the like.

A further need exists for mixing apparatus and methods allowing overlap between the LO, IF and RF frequency ranges, without undue coupling of signals between the LO, IF and RF signal ports. Overlap of the RF and IF ranges is illustrated in the example of FIG. 1.

SUMMARY OF THE INVENTION

According to the present invention, a novel method and apparatus for achieving high frequency mixing of signals to produce product signals are described.

A signal mixing apparatus Comprises a first signal splitting/combining network having first through fourth ports, wherein there is substantially no relative phase shift between the first port and the second port and between the first port and the third port and between the second port and the fourth port, and wherein there is substantially 180° relative phase shift between the third port and the fourth port and further comprises a second signal splitting/combining network having first through fourth ports, wherein there is substantially no relative phase shift between the first port and the second port and between the first port and the third port and between the second port and the fourth port, and wherein there is substantially 180° relative phase shift between the third port and the fourth port. The apparatus also includes a four port mixer element having two ports coupled to the second and third ports of the first signal splitting/combining network and having another two ports coupled to the second and third ports of the second signal splitting/combining network. The apparatus further comprises a first input/output port (e.g., IF) coupled to the first port of the second signal splitting/combining network, a second input/output port (e.g., LO) coupled to the first port of the first signal splitting/combining network, and a third input/output port (e.g., RF) coupled to the fourth port of the first signal splitting/combining network.

A method for mixing a first signal and a second signal to produce a third signal includes the step of applying the first and second signals to a first four port signal splitting/combining network, wherein there is no relative phase shift between a second and a third port of the first signal splitting/combining network relative to a first port thereof. A subsequent step couples the first and second signals from the first four port signal splitting/combining networks to a four port diode mixer element and couples the third signal from the diode mixer element to a second four port signal splitting/combining network, wherein there is no relative phase shift between a second and a third port of the second signal splitting/combining network relative to a first port thereof. A third step extracts the third signal but not the first and second signals from the second four port signal splitting/combining network.

The method desirably but not essentially includes the steps of impedance matching the first four port signal splitting/combining network to the four port diode mixer element at the first and second frequencies and of removing the second frequency signal from the third frequency signal by means of a circuit resonant at the second frequency and which is coupled to two ports of the first four port signal splitting/combining network.

Alternatively, the method for mixing a first signal and a second signal to produce a third signal includes the step of applying the first signal to a first four port signal splitting/combining network, wherein there is no relative phase shift between a second and a third port of the first signal splitting/combining network relative to a first port thereof. A subsequent step applies the second signal to a second four port signal splitting/combining network, wherein there is no relative phase shift between a second and a third port of the second signal splitting/combining network relative to a first port thereof. A third step couples the first and second signals from the first and second four port signal splitting/combining networks to a four port diode mixer element and also couples the third signal from the diode mixer element to the first four port signal splitting/combining network, wherein there is no relative phase shift between the second port of the first signal splitting/combining network relative to a fourth port thereof, and a 180° relative phase shift between the third port of the first signal splitting/combining network relative to a fourth port thereof. A fourth step extracts the third signal but not the first and second signals from the first four port signal splitting/combining network.

The above and other features and advantages of the present invention will be better understood from the following detailed description taken in conjunction with the accompanying drawing.

BRIEF DESCRIPTION OF THE DRAWING

FIG. 5 is a schematic diagram of a phase shift network including filter means in accordance with a preferred embodiment of the present invention;

FIG. 6 is a schematic diagram of a circuit for realizing the circuit of FIG. 5 in MMIC form, in accordance with a preferred embodiment of the present invention;

FIG. 7A is a schematic diagram of an LO/RF matching circuit in accordance with a preferred embodiment of the present invention;

FIG. 7B is a schematic diagram of an IF matching circuit in accordance with a preferred embodiment of the present invention;

FIG. 8 is a graph of the predicted conversion loss and bandwidth of down conversion operation for the mixing apparatus for two different power levels, in accordance with an example of the present invention; and FIG. 9 is a graph of the predicted isolation between the LO and IF ports for the mixing apparatus, in accordance with an example of the present invention.

DETAILED DESCRIPTION OF THE DRAWING

Figure 1:
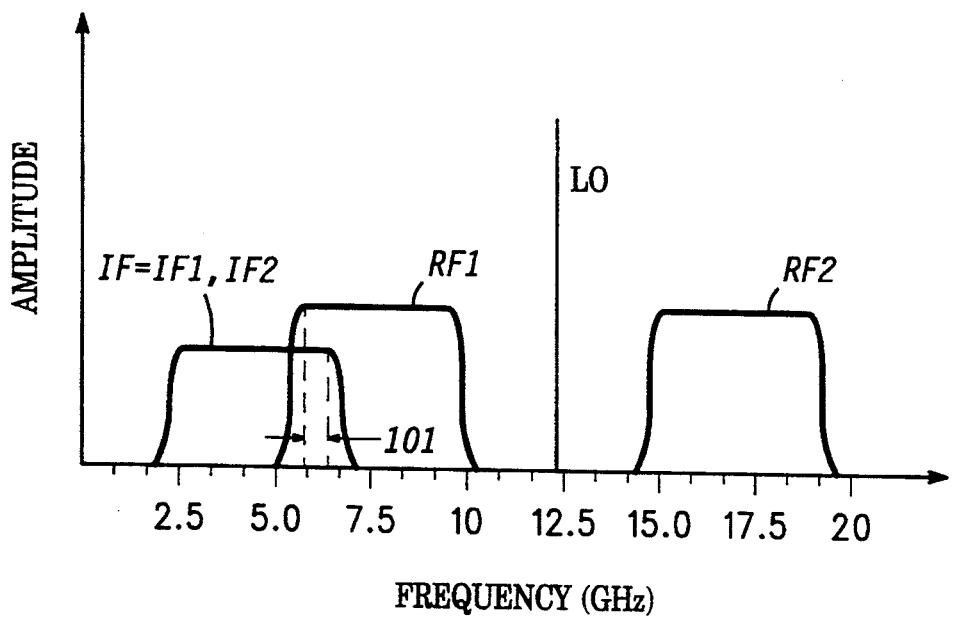
FIG. 1 is a simplified representation of RF, LO, and IF signals of different frequencies showing how RF signals RF1, RF2 are related in frequency to IF signals IF1, IF2.
Figure 2:
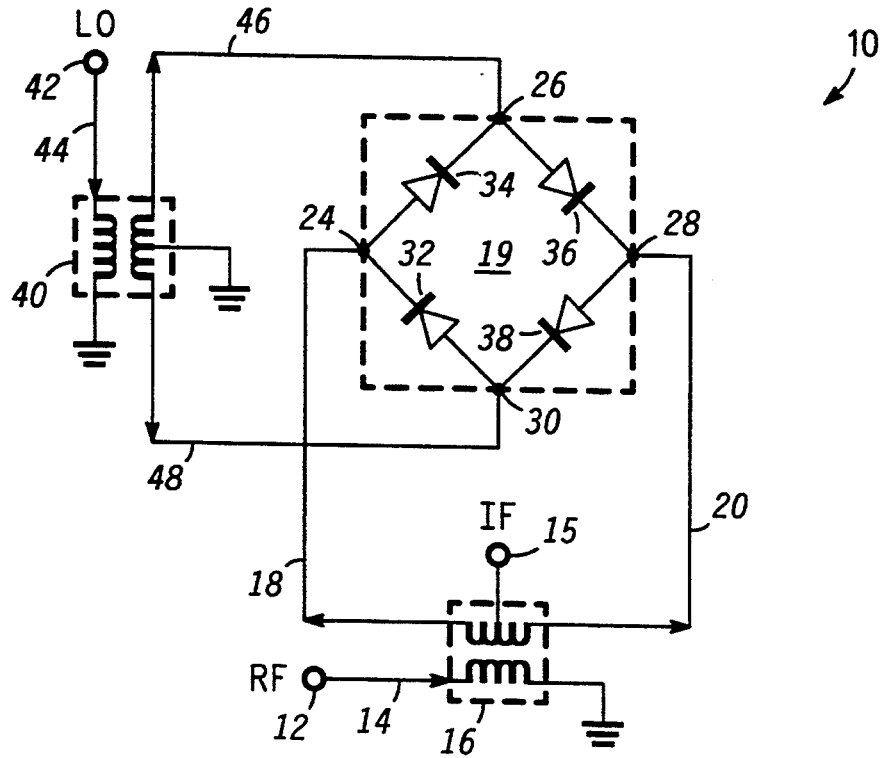
FIG. 2 is a simplified schematic representation of a double balanced mixer apparatus, according to the prior art.
Figure 3:
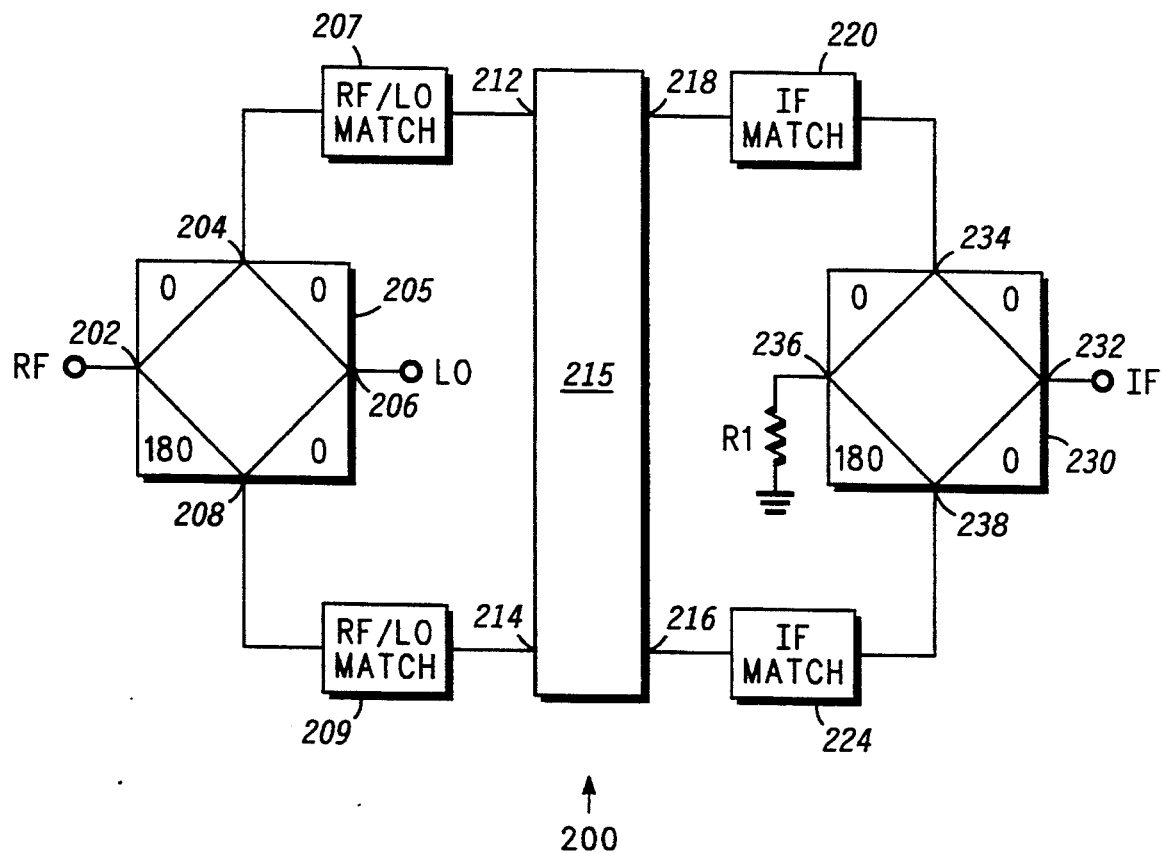
FIG. 3 is a schematic diagram of a broadband mixer circuit in accordance with a preferred embodiment of the present invention.

FIG. 3 is a schematic diagram of broadband mixer circuit 200 in accordance with a preferred embodiment of the present invention. Circuit 200 comprises first four port phase shift network 205, also referred to as a four port signal splitting/combining network, having ports 202, 204, 206, 208, IF matching circuits 220, 224, four port mixer element 215, RF/LO matching circuits 207, 209, and second four port phase shift network 230 having ports 232, 234, 236, 238 and resistor R1. Ports 202, 206 of four port phase shift network 205 and port 232 of four port phase shift network 230 function as either input or output ports, also referred to as I/O ports, depending upon the particular application of mixer apparatus 200.

Each four port phase shift network 205, 230 is shown as a diamond with four internal connections representing different paths between ports of the four port phase shift network. The number beside each internal connection identifies the phase shift through that path relative to any other path. For example, as a portion of a signal incident upon port 202 (or 236) of four port phase shift network 205 (or 230) passes through the "180" path to port 208 (or 238), it undergoes a phase shift of 180°, relative to the signal passing through the "0" path to port 204 (or 234). Similarly, incident signal energy passing through the "0" path from port 206 (or 232) of four port phase shift network 205 (or 230) to ports 204, 208 (or 234, 238) undergoes a relative phase shift of 0°. In an analogous manner, signals entering at ports 204, 208 (or 234, 238) undergo the indicated net phase differences before emerging at ports 202, 206 (or 232, 236).

This allows ports 202, 206 to be isolated from one another. Signals originating at port 206 may cause energy to 35 be transmitted into ports 204, 208 and then further to port 202. However, because there is 180° of phase shift between the two paths, these signals will destructively interfere with one another and cancel at port 202.

Those of skill in the art will understand that the phase shift amounts indicated in FIG. 3 are relative phase shift amounts and not absolute phase shift amounts. Those of skill in the art will also recognize that while a given network or port may have a designation of input or output or both in a given modulation or demodulation application of mixing apparatus 200, any port 202, 204, 206, 208, 232, 234, 236, 238 of four port phase shift network 205 or 230 can function as an input, an output, or as both.

Improved efficiency of operation of mixing apparatus 200 is obtained by including matching elements 207, 209 between ports 212, 204 and ports 214, 208 of mixer element 215 and four port phase shift network 205, respectively, and matching elements 220, 224 between ports 218, 234 and 216, 238 of four port mixer element 215 and four port phase shift network 230, respectively. Matching elements 207, 209 minimize electrical reflections of signals from I/O ports 202, 206. The configuration of FIG. 3 does not require matching elements 207, 209 to maximize the reflection of IF signal energy from ports 212, 214, because these signal components cancel. Matching elements 220, 224 minimize electrical reflections between ports 218, 234 and 216, 238 at the intermediate frequency. Matching elements 207, 209, 220, 224 may comprise inductors, capacitors, resistors or a combination thereof, but preferably are inductors, or inductor-capacitor combinations chosen to maximize power transfer to four port mixer element 215 in accordance with design principles well known in the art.

Figure 4:
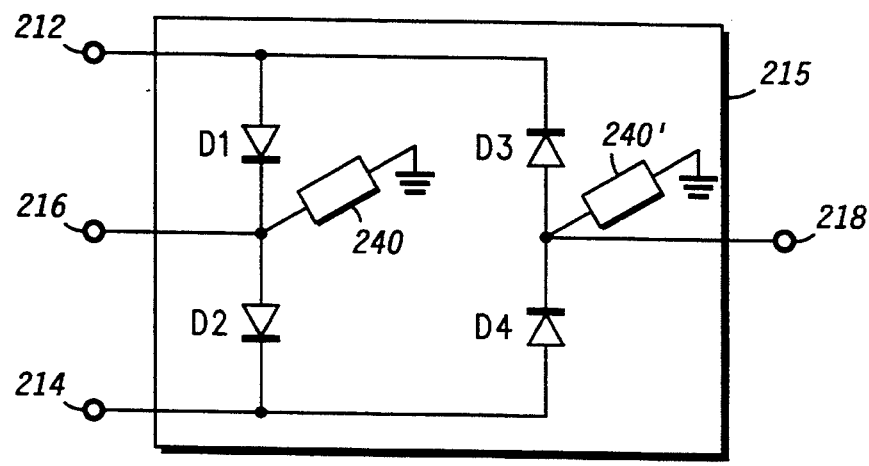
FIG. 4 is a schematic diagram of a four port diode mixer element in accordance with one embodiment of the invention.

FIG. 4 is a schematic diagram of four port mixer element 215 in accordance with one embodiment of the invention. Mixer element 215 comprises four diodes D1, D2, D3, D4, and desirable resonant circuits 240, 240'. Diodes D1-D4 are arranged such that they form a ring, with all of diodes D1-D4 pointing in the same direction around the ring. Resonant circuits 240, 240' are desirably employed for preventing signals originating from port 206 of four port phase shift network 205 from appearing at IF port 232 (FIG. 3) of four port phase shift network 230. Resonant circuits 240, 240' should provide substantially a short circuit at the LO frequency but not at the intermediate frequency. Resonant circuits 240, 240' are conveniently implemented as series resonant inductor-capacitor circuits or as open-circuited transmission line stubs of lengths chosen to cause a low impedance to be presented at the LO signal frequency. Such resonant circuits are well known in the art. Either of these and other embodiments can be readily realized in forms compatible with MMIC fabrication technology. The resonator topology, by shorting the LO signal to ground, results in isolation between the LO and IF ports. Hence, the resonator bandwidth defines the LO to IF bandwidth.

Signals are applied to ports 212, 214, 216, 218 of four port mixer element 215 where two of the RF, IF and LO signals are combined to produce the remaining signal. The RF signals substantially cancel at ports 216, 218, and completely at port 232. Since RF signals at ports 212 and 214 are 180° displaced in phase, they cancel at ports 216 and 218. Thus, no RF energy is transmitted to port 232. The LO signal is not cancelled at ports 212, 214, but is removed at 216, 218 by resonant circuits 240, 240'. Thus, resonant circuits 240, 240' provide the desired isolation of the LO signal from the RF and IF ports, and also define the LO-IF isolation bandwidth. The relative IF signal phase $\phi_{IF}$ associated with each diode is given by the relations:

(4) $\phi_{IF} = \phi_{LO} - \phi_{RF} + \phi_D$ (down conversion to IF), (4) $\phi_{IF} = \phi_{RF} - \phi_{LO} + \phi_D$ (up conversion to IF), where $\phi_D$ is the diode phase, with a value of 0° corresponding to a diode having the cathode connected to either of nodes 216, 218, and where $\phi_D$ is 180° otherwise. Further, $\phi_{RF}$ is the phase of the received radio frequency signal at one diode (e.g, node 212 of FIG. 3) relative to the phase at any other diode (e.g., node 214), while $\phi_{LO}$ is the relative phase of the LO frequency signal, similarly measured from one diode to another. $\phi_{IF}$ of equation (4) is the relative phase of the intermediate frequency signal produced by the RF and LO signals, when the intermediate frequency is the difference of the RF and LO frequencies. $\phi_{IF}$ of equation (5) is the relative phase of the intermediate frequency signal when it is the sum of the RF and LO signal frequencies. The phase states for this example are given below in Table I. Equations (4)–(5) and the identification of the relative phase of the various signals are explained, for example, in B. J. Hallford, "Trace Phase States to Check Mixer Designs," *Microwaves*, June 1980, pp. 52–60.

The $\phi_{IF}$ values given in Table I show that the IF signals are in phase with one another at port 232. The means by which this is accomplished may be better understood by reference to Phase Analysis Table I below showing the relative phase of the various signals within mixing apparatus 200, according to equations (1)–(5) and the convention of Hallford, supra.

TABLE I

| | PHASE ANALYSIS | | | |
|---|---|---|---|---|
| REF. NODE | NODE 216 | | NODE 218 | |
| DIODE | D1 | D2 | D3 | D4 |
| $\phi_{RF}$ | 180 | 0 | 180 | 0 |
| $\phi_{LO}$ | 0 | 0 | 0 | 0 |
| $\Delta\phi_D$ | 0 | 180 | 180 | 0 |
| $\phi_{IF}$ | 180 | 180 | 0 | 0 | where $\phi_{IF}=\phi_{LO}-\phi_{RF}-\Delta\phi_D$, and $\phi_{IF}$ identified intermediate frequency components as they appear at nodes 216 and 218 of FIGS. 3 and 4. The IF signal components appearing at node 212 are 180° degrees out of phase (see $\phi_{IF}$ of Table 1 for diodes D1, D3) and so these IF Signal components cancel. Similarly, at node 214, the IF signal contributions also cancel (see $\phi_{IF}$ of Table 1 for diodes D2, D4).

FIG. 5 is a schematic diagram of four port phase shift network 500 suitable for use as networks 205, 230 of the present invention. See for example U.S. Pat. Nos. 5,045,821 and 5,023 576 Network 500 includes low pass filters 522, 526, 528, high pass filter 524, and ports 501, 502, 503, 504 in accordance with a preferred embodiment of the present invention. Alternatively, network 500 could comprise a low pass filter for filter 524 and high pass filters for filters 522, 526 and 528. Other means for realizing the function of four port phase shift network 500, for example various lengths of transmission lines providing appropriate phase shifts, can also be used. Suitable lumped element and transmission line networks are well known in the art.

FIG. 6 is a schematic diagram of circuit 620 for realizing circuit 500 of FIG. 5 in MMIC form, in accordance with a preferred embodiment of the present invention. FIG. 6 shows a schematic diagram of circuit 620 comprising ports 601, 602, 603 and 604, low pass filters 622, 626 and 628, and high pass filter 624, all of which are second-order filter circuits. The function provided by circuit 620 is conveniently realized through second-order filter circuits but can also be fulfilled by means of other filter orders, for example first, third, or any other order filter.

Low pass filter 622 comprises ports 601, 602, inductors L1, L2 connected in series therebetween, and capacitors C1, C2. Capacitor C1 is connected between ground and the node joining inductors L1, L2, while capacitor C2 is connected between port 602 and ground.

Low pass filter 626 comprises ports 602, 604, inductors L3, L4 connected in series therebetween, and capacitors C3, C4. Capacitor C3 is connected between ground and the node joining inductors L3, L4, while capacitor C4 is connected between port 604 and ground.

Low pass filter 628 comprises ports 604, 603, inductors L8, L7 connected in series therebetween, together with capacitors C8, C7. Capacitor C7 is connected between ground and the node joining inductors L8, L7, while capacitor C8 is connected between port 604 and ground. In practice, capacitors C4, C8 are combined into a single capacitor, for example, C4, having a capacitance value given by the sum of the calculated values for C4 and C8, inasmuch as capacitors C4 and C8 are connected in parallel.

High pass filter 624 comprises ports 603, 601, capacitors C6, C5 connected in series therebetween, and inductors L5, L6. Inductor L5 is connected between ground and the node joining capacitors C5, C6. Inductor L6 is connected between port 603 and ground.

FIG. 7A is a schematic diagram of matching circuit 710 comprising inductors L9, L10 in accordance with a preferred embodiment of the present invention. FIG. 7B is a schematic diagram of matching circuit 720 comprising inductor L11 and capacitor C9 in accordance with a preferred embodiment of the present invention. Matching circuits 710, 720 can comprise any combination of reactive (e.g., capacitors, inductors) components needed in order to increase power transfer across matching circuits 710, 720.

Inductors, capacitors and resistors such as are illustrated in FIGS. 3, 6 and 7 may be readily fabricated using IC process techniques in a manner compatible with MMIC's. For example, resistors are formed from polycrystalline or single crystal semiconductor regions of various doping or by using thin film materials, as for example, NiCr, TiW, TaN and the like. Capacitors are formed using metal layers or semiconductor layers or a combination thereof spaced apart by dielectrics otherwise available during IC fabrication, as for example, SiO, $SiO_2$, $Si_3N_4$ or combinations thereof. Inductors are formed using metal regions of spiral shape and/or other geometries well known in the art. Al and Au are non-limiting examples of metals commonly used for conductors in IC's. Means and methods for fabricating such conductor, resistor, capacitor and/or inductor elements using the same techniques employed in IC fabrication are well known in the art.

The lumped element circuits depicted in FIGS. 6, 7A, 7B are easily mass produced by photolithographic techniques well known in the art. These lumped elements are typically a fraction of a millimeter on a side and are formed already interconnected to one another, reducing assembly labor.

EXAMPLE

The mixing circuit of the present invention described in connection with FIGS. 3–7B was simulated using a well known analog simulation program called LIBRA, provided by EEsof, Inc., of Westlake Village, CA. This simulation program is known to provide predicted results which are very close to the results actually observed when the simulated circuit is constructed.

The diodes of mixer element 215 of FIG. 4 were assumed to be Schottky barrier diodes (e.g., diodes D1, D2, D3, D4 of FIG. 4) fabricated on epitaxially grown gallium arsenide material with a zero bias capacitance of 0.034 picoFarads, a series resistance of 14 Ohms, and 60 by 0.25 micrometer junction area.

Referring to FIG. 6, typical values of L1-L8 and C1-C7 for four port phase shift network 205 of FIG. 3 for operation in the IF frequency range of 2 to 7 GigaHertz together with an LO frequency of 12 GigaHertz are L1=1.138 nanoHenries, L2=2.00 nanoHenries, L3=1.138 nanoHenries, L4=2.00 nanoHenries, L5=2.46 nanoHenries, L6=4.36 nanoHenries, L7=1.138 nanoHenries, L8=2.00 nanoHenries, C1=0.566 picoFarads, C2=0.322 picoFarads, C3=0.566 picoFarads, C4=0.322 picoFarads, C5=1,232 picoFarads, C6=0.689 picoFarads, C7=0.566 picoFarads, and C8=0.322 picoFarads. Similar values of L1-L8 and C1-C7 of FIG. 6 for four port phase shift network 230 (FIG. 3) for operation in the same frequency range of 5–10 GigaHertz are L1=0,569 nanoHenries, L2=1.00 nanoHenries, L3=0.569 nanoHenries, L4=1.00 nanoHenries, L5=1.23 nanoHenries, L6=2.18 nanoHenries, L7=1,138 nanoHenries, L8=2.00 nanoHenries, C1=0,161 picoFarads, C2=0,161 picoFarads, C3=0.283 picoFarads, C4=0.161 picoFarads, C5=0.616 picoFarads, C6=0,349 picoFarads, C7=0,283 picoFarads, and C8=0,161 picoFarads. The foregoing L, C and diode parameter values were used for the lumped elements of FIG. 6 to model the performance of circuit 200 and mixer element 215 (FIGS. 3 and 4). The correspondence between ports of four port phase shift networks 205, 230 of FIG. 3, 500 of FIG. 5, and 620 of FIG. 6 is as follows. Ports 202, 204, 206, 208 and 236, 234, 232, 238 of four port phase shift networks 205, 230 of FIG. 3 and ports 501, 502, 504, 503 of four port phase shift network 500 correspond to ports 601, 602, 604 and 603 of FIG. 6, respectively.

Inductor values of L9=0.10 nanoHenries and L10=5.00 nanoHenries were employed to model RF/LO matching circuits 207, 209 of FIG. 7A. In matching circuit 207 (or 209), inductor L9 is connected between port 212 (or 214) of four port mixer element 215 and port 204 (or 208) of four port phase shift network 205, and inductor L10 is connected from port 212 (or 214) to ground to simulate RF/LO matching network 207 (or 209). Inductor values of L11=0.01 nanoHenries and capacitor values of C9=0.01 picoFarads were employed for simulating IF matching networks 220 (or 224) as shown in FIG. 7B, with capacitor C9 of IF matching network 220 (or 224) connected between port 234 (or 238) of four port phase shift network 230 and ground.

FIGS. 8-9 show results obtained from modelling the performance of circuit 200 (FIG. 3). FIG. 8 is a graph of predicted conversion loss versus RF frequency of mixing apparatus 200 for two different LO power levels and with a LO frequency of 12 GigaHertz. Trace 810 describes the mixing apparatus performance for an LO power level of +12 dBm, while trace 820 describes performance for an LO power level of +10 dBm. It will be noted that the RF bandwidth extends from about 5.5 to about 9.5 GigaHertz. The IF frequency varies from about 2.5 to 6.5 GigaHertz, overlapping the lower edge of the RF band.

FIG. 9 is a graph of the predicted isolation 910 between the LO and IF ports for the mixing apparatus versus LO frequency when optional resonant circuit 240 is represented in the model as a pair of quarter-wavelength open circuited transmission lines having a characteristic impedance of 100 Ohms. Data 910 illustrated in FIG. 9 show that excellent isolation of the LO frequency signal is predicted at frequencies of 11.8-12.2 GigaHertz.

FIG. 8 shows that efficient mixer operation is predicted at moderate LO power levels. FIG. 9 shows that excellent LO-IF isolation is obtained, despite overlap of the RF and IF bands (i.e., IF=2.5-6.5 GigaHertz, RF=5.5-9.5 GigaHertz).

A method for mixing a first signal and a second signal to produce a third signal comprises the steps of (i) applying the first and second signals to a first four port signal splitting/combining network, wherein there is no relative phase shift between a second and a third port of the first signal splitting/combining network relative to a first port thereof, (ii) coupling the first and second signals from the first four port signal splitting/combining networks to a four port diode mixer element and coupling the third signal from the diode mixer element to a second four port signal splitting/combining network, wherein there is no relative phase shift between a second and a third port of the second signal splitting/combining network relative to a first port thereof, and (iii) extracting the third signal but not the first and second signals from the second four port signal splitting/combining network.

The method desirably but not essentially includes the step of impedance matching the first four port signal splitting/combining network to the four port diode mixer element at the frequency of the first and second signals.

The method desirably but not essentially includes the step of impedance matching the second four port signal splitting/combining network to the four port diode mixer element at the frequencies of the third signal.

The method desirably but not essentially includes the step of removing the second signal from the third signal by means of a circuit which is resonant at the frequency of the second signal and which is coupled to two ports of the second four port signal splitting/combining network.

An alternative method for mixing a first signal and a second signal to produce a third signal comprises the steps of (i) applying the first signal to a first four port signal splitting/combining network, wherein there is no relative phase shift between a second and a third port of the first signal splitting/combining network relative to a first port thereof, (ii) applying the second signal to a second four port signal splitting/combining network, wherein there is no relative phase shift between a second and a third port of the first signal splitting/combining network relative to a first port thereof, (iii) coupling the first and second signals from the first and second four port signal splitting/combining networks to a four port diode mixer element and coupling the third signal from the diode mixer element to the first four port signal splitting/combining network, wherein there is no relative phase shift between the second port of the first signal splitting/combining network relative to a fourth port thereof, and a 180° relative phase shift between the third port of the first signal splitting/combining network relative to a fourth port thereof, and (iv) extracting the third signal but not the first and second signals from the second four port signal splitting/combining network.

The alternative method desirably but not essentially includes the step of impedance matching the first four port signal splitting/combining network to the four port diode mixer element at the frequency of the first signal.

The alternative method desirably but not essentially includes the step of impedance matching the second four port signal splitting/combining network to the four port diode mixer element at the frequencies of the second and third signals.

The alternative method desirably but not essentially includes the step of removing the second signal from the third signal by means of a circuit which is resonant at the frequency of the second signal and which is coupled to two ports of the second four port signal splitting/combining network.

Based on the foregoing description, it will be apparent to those of skill in the art that the present invention solves the problems and achieves the purposes set forth earlier, and has substantial advantages as pointed out herein, namely, providing broadband and efficient signal conversion and high IF-LO isolation coupled with overlap between the RF, IF and LO frequencies. A further advantage is that the invention also is realizable using relatively few components which are readily integratable in and/or on MMIC's and the like.

A further advantage of the present invention is a mixing apparatus and method allowing overlap between the RF, IF and LO frequency ranges, without undue coupling of signals between the RF, IF and LO signal ports.

While the present invention has been described in terms of particular arrangements, elements, structures and steps, these choices are for convenience of explanation and not intended to be limiting and, as those of skill in the art will understand based on the description herein, the present invention applies to other choices of arrangements, elements, structures and steps, and it is intended to include in the claims that follow, these and other variations as will occur to those of skill in the art based on the present disclosure.

What is claimed is:

1. A method for mixing a first signal and a second signal to produce a third signal, said method comprising steps of:

applying the first signal to a first port of a first four port signal splitting/combining network, wherein there is no relative phase shift between a second and a third port of the first signal splitting/combining network relative to the first port;

applying the second signal to a fourth port of the first four port signal splitting/combining network, wherein there is one hundred eighty degrees of relative phase shift between the third port of the first signal splitting/combining network relative to the fourth port;

coupling the first and second signals from the second and third ports of the first four port signal splitting/combining network first and second ports, respectively, of a four port diode mixer element;

coupling the third signal from third and fourth ports of the four port diode mixer element to second and third ports of a second four port signal splitting/combining network, wherein there is no relative phase shift between the second and third ports of the second signal splitting/combining network relative to a fourth port thereof; and extracting the third signal but not the first and second signals from the fourth port of the second four port signal splitting/combining network.

2. A method as claimed in claim 1, wherein coupling the first and second signals includes a step of impedance matching the second and third ports of the first four port signal splitting/combining network to the first and second ports of the four port diode mixer element, respectively, at the frequencies of the first and second signals.

3. A method as claimed in claim 1, wherein coupling the third signal includes a step of impedance matching the second and third ports of the second four port signal splitting/combining network to the third and fourth ports of the four port diode mixer element, respectively, at the frequency of the third signal.

4. A method as claimed in claim 1, wherein coupling the third signal includes steps of:

removing a first part of the second signal from the third signal by means of a first circuit which is resonant at the frequency of the second signal and which is coupled between the second port of the second four port signal splitting/combining network and the third port of the four port diode mixer element; and removing a second part of the second signal from the third signal by means of a second circuit which is resonant at the frequency of the second signal and which is coupled between the third port of the second four port signal splitting/combining network and the fourth port of the four port diode mixer element.

5. A method for mixing a first signal and a second signal to produce a third signal, comprising steps of:

applying the first signal to a fourth port of a first four port signal splitting/combining network, wherein there is no relative phase shift between a second and a third port of the first signal splitting/combining network relative to the fourth port thereof;

applying the second signal to a fourth port of a second four port signal splitting/combining network, wherein there is no relative phase shift between a second and a third port of the first signal splitting/combining network relative to the fourth port thereof;

coupling the first signal from the second and third ports of the first four port signal splitting/combining network to first and second ports of a four port diode mixer element, respectively;

coupling the second signal from the second and third ports of the second four port signal splitting/combining network to third and fourth ports of the four port diode mixer element, respectively;

coupling the third signal from the first and second ports of the four port diode mixer element to the second and third pots of the first four port signal splitting/combining network, wherein there is no relative phase shift between the second port of the fist signal splitting/combining network relative to a first port thereof, and a 180° relative phase shift between the third port of the first signal splitting/combining network relative to a first port thereof; and extracting the third signal but not the first and second signals from a first port of the first four port signal splitting/combining network.

6. A method as claimed in claim 5, wherein coupling the first signal includes a step of impedance matching the second and third ports of the first four port signal splitting/combining network to the first and second ports, respectively, of the four port diode mixer element at the frequency of the first signal.

7. A method as claimed in claim 5, wherein coupling the second signal includes a step of impedance matching the second and third ports of the second four port signal splitting/combining network to the third and fourth ports, respectively, of the four port diode mixer element at the frequency of the third signal.

8. A method as claimed in claim 5, wherein coupling the third signal includes steps of:

removing a first part of the first signal from the third signal by means of a first circuit which is resonant at the frequency of the first signal and which is coupled between the second port of the first four port signal splitting/combining network and the first port of the four port diode mixer.

9. A signal mixing apparatus comprising:

a first signal splitting/combining network having first through fourth ports, wherein there is substantially no relative phase shift between the first port and the second port and between the first port and the third port and between the second port and the fourth port, and wherein there is substantially 180° relative phase shift between the third port and the fourth port;

a second signal splitting/combining network having first through fourth ports, wherein there is substantially no relative phase shift between the first port and the second port and between the first port and the third port and between the second port and the fourth port, and wherein there is substantially 180° relative phase shift between the third port and the fourth port;

a four port mixer element having two ports coupled to said second and third ports of said first signal splitting/combining network and having another two ports coupled to said second and third ports of said second signal splitting/combining network;

a first input/output port coupled to said first port of said second signal splitting/combining network;

a second input/output port coupled to said first port of said first signal splitting/combining network; and a third input/output port coupled to said fourth port of said first signal splitting/combining network.

10. A signal mixing apparatus as claimed in claim 9, wherein said first signal splitting/combining network comprises a lumped-element circuit.

11. A signal mixing apparatus as claimed in claim 9, wherein said second signal splitting/combining network comprises a lumped-element circuit.

12. A signal mixing apparatus as claimed in claim 10, wherein said lump-element circuit further is fabricated in thin-film form.

13. A signal mixing apparatus as claimed in claim 11, wherein said lump-element circuit further is fabricated in thin-film form.

14. A signal mixing apparatus as claimed in claim 9 wherein said four port mixer element comprises a four diode ring circuit.

15. A signal mixing apparatus as claimed in claim 14, wherein said four diode ring circuit further is fabricated in thin-film form.

16. A signal mixing apparatus as claimed in claim 9, wherein said first and second signal splitting/combining networks are coupled to said four port mixer element by means of impedance matching circuits.

17. A signal mixing apparatus as claimed in claim 9, wherein said four port mixer element includes a first and a second resonant circuit for removing signals originating from said second input/output port.

18. A signal mixing apparatus comprising:
a first four port phase shifting network comprising lumped inductors and capacitors and having substantially no relative phase shift between a second and a third port thereof with respect to a first port and between said second port and a fourth port thereof, and having 180° of phase shift between said third port thereof and said fourth port;

a second four port phase shifting network comprising lumped inductors and capacitors and having substantially no relative phase shift between a second and third port thereof with respect to a first port and between said second port and a fourth port thereof, and having 180° of phase shift between said third port thereof and said fourth port;

a four port mixer network comprising four diodes connected in a ring arrangement and having a first two ports coupled to said second and third ports of said first four port phase shifting network and having a second two ports coupled to said second and third ports of said second four port phase shifting network;

a first input/output port coupled to said first port of said second four port phase shifting network;

a second input/output port coupled to said first port of said first four port phase shifting network; and a third input/output port coupled to said fourth port of said first four port phase shifting network.

19. A signal mixing apparatus as claimed in claim 18, wherein said first and second four port phase shifting networks are fabricated in thin-film form.

20. A signal mixing apparatus as claimed in claim 19, wherein said four port mixer network is fabricated in thin-film form co-integrated with said first and second four port phase shifting networks.

21. A signal mixing apparatus as claimed in claim 18, wherein said first and second four port phase shifting networks are coupled to said four port mixer network by means of impedance matching circuits.

22. A signal mixing apparatus as claimed in claim 18, wherein said four port mixer network further includes:
a first resonant circuit coupled to a first of said first two ports for eliminating signals from said second input/output port from said first input/output port; and a second resonant circuit coupled to a second of said first two ports for eliminating signals from said second input/output port from said first input/output port.

23. A method as claimed in claim 1, wherein the first signal is a local oscillator signal, the second signal is a radio frequency signal and the third signal is an intermediate frequency signal.

24. A method as claimed in claim 5, wherein the first signal is a local oscillator signal, the second signal is an intermediate frequency signal and the third signal is a radio frequency signal.

25. A signal mixing apparatus as claimed in claim 9, wherein:
said first input/output port comprises an intermediate frequency signal port;
said second input/output port comprises a local oscillator signal port; and
said third input/output port comprises a radio frequency signal port.

26. A signal mixing apparatus as claimed in claim 18, wherein:
said first input/output port comprises an intermediate frequency signal port;
said second input/output port comprises a local oscillator signal port; and
said third input/output port comprises a radio frequency signal port.

* * * * *